United States Patent [19]

Ilegems et al.

[11] 4,127,862

[45] Nov. 28, 1978

[54] INTEGRATED OPTICAL DETECTORS

[75] Inventors: Marc Ilegems, Summit; Louis A. Koszi, Scotch Plains; Bertram Schwartz, Westfield, all of N.J.

[73] Assignee: Bell Telephone Laboratories, Incorporated, Murray Hill, N.J.

[21] Appl. No.: 830,438

[22] Filed: Sep. 6, 1977

[51] Int. Cl.² .................... H01L 27/14; H01L 29/161
[52] U.S. Cl. ...................................... 357/30; 357/16; 357/12; 357/40; 357/45; 357/55
[58] Field of Search .................. 357/30, 16, 12, 40, 357/45, 55

[56] References Cited

U.S. PATENT DOCUMENTS

| 3,353,114 | 11/1967 | Hanks | 331/94.5 |
| 3,514,715 | 5/1970 | Kosonocky | 331/94.5 |
| 3,604,987 | 9/1971 | Assour | 250/209 |
| 3,659,159 | 4/1972 | Nogata | 317/235 R |
| 3,852,591 | 12/1974 | Lee | 250/211 J |
| 4,015,280 | 3/1977 | Matsushita | 357/30 |
| 4,017,332 | 4/1977 | James | 136/89 PC |

*Primary Examiner*—Martin H. Edlow
*Attorney, Agent, or Firm*—Michael J. Urbano

[57] ABSTRACT

A plurality $n$ of double heterostructure photodiodes are coupled together by $(n-1)$ interleaved $n^+ - p^+$ tunnel junctions to form a multi-layered integrated structure which has an open circuit photovoltage approaching the sum of the open circuit photovoltages of the individual photodiodes. In one embodiment, in which radiation to be detected is made incident normal to the layers, the absorbing layers of the photodiodes get progressively thicker away from the substrate. In a second embodiment, in which the radiation is made incident parallel to the layers, all of the absorbing layers have essentially the same thickness. In a third embodiment, in which radiation is made incident normal to the layers, the structure has a stepped configuration and all of the absorbing layers have essentially the same thickness.

25 Claims, 3 Drawing Figures

INTEGRATED OPTICAL DETECTORS

BACKGROUND OF THE INVENTION

This invention relates to the conversion of optical radiation to electrical power or to an electrical signal.

A practical telecommunication system, such as one designed to carry telephone conversations between subscribers, includes several basic equipments: transducers (e.g., carbon microphones) for converting information encoded in acoustical energy (voice) to another energy form (e.g., electrical, optical) more suitable for transmission; transmission media (e.g., wire pairs, optical fibers) for carrying that energy from one location (e.g., subscriber premises) to another; switching equipment (e.g., crossbar, ESS) capable of interconnecting any pair of subscribers to one another over such transmission media; and supervisory signaling equipment (e.g., a bell or lamp and associated power sources) which, for example, alerts a subscriber to an incoming call.

As suggested parenthetically above, one type of telecommunication system relies, at least in part, on certain functions being carried out with energy in its optical form. Thus, there have been a number of speculative systems proposed for performing the switching function optically, but primary emphasis to date has been on fiber optic transmission systems in which electrical pulses representing encoded voice or data are used in a transmitter to pulse modulate a junction laser or LED acting as a carrier. The PCM optical signal is then carried over glass fibers to a receiver where it is detected by a Si photodiode (e.g., a p-i-n or avalanche photodiode of the type described in copending application Ser. No. 793,493 filed on May 4, 1977 by A. R. Hartman et al and assigned to the assignee hereof.) Fiber optic systems have been used to interconnect central offices but, as yet, have not been incorporated into the subscriber loop — i.e., the interconnection between a central office and a subscriber's premises. For this reason, and at least one other, virtually no attention has been given to optically powering telephone equipment (e.g., a station set) — it being assumed that local electrical power, such as that presently supplied by a central office battery for electrical systems, would be utilized.

Another reason why optical powering has been all but ignored arises from the low voltages available from photodiodes — the front runner of photodetectors for optical telecommunication systems. For example, one of the more attractive photodiode candidates is a double heterostructure of AlGaAs-GaAs-AlGaAs layers in which radiation is made incident normal to the layers and generates photocarriers in the light absorbing GaAs layer. While this device is characterized by a high power conversion efficiency (e.g., 53% at 8150 Angstroms), it produces a maximum photovoltage of only about 85% of bandgap (i.e., yielding about 1.2 V) because of recombination in the GaAs layer. Yet, in a number of telephone equipments higher voltage is required (e.g., about 5 V for a bell ringer). The simple apparent solution would be to make a plurality of discrete photodiodes and connect them in a series, voltage adding relationship. Unfortunately, however, the size of such a configuration would require some form of beam splitting arrangement to direct the radiation to be detected (e.g., from an optical fiber) to each separate photodiode. To circumvent this size problem, the photodiodes might be stacked in an integrated structure, but the resulting p-n-p-n . . . configuration would result in a voltage drop across each interface between adjacent photodiodes. Such voltage drops subtract from the total photovoltage thus defeating the purpose of the series arrangement.

SUMMARY OF THE INVENTION

We have developed an optical detector comprising a plurality $n$ of photodiodes coupled together by $(n-1)$ interleaved tunnel junctions to form a multilayered, integrated structure which has an open circuit photovoltage approaching the sum of the open circuit photovoltages of the individual photodiodes. The tunnel junctions, which are inherently forward-biased under normal operation of the detector, act as low voltage-drop interfaces so that comparatively little of the total photovoltage is cancelled at the interface between photodiodes.

In a preferred embodiment AlGaAs-GaAs-AlGaAs double heterostructures are used as the photodiodes and degenerately doped $n^+$-$p^+$ GaAs layers form the tunnel junctions. This detector is particularly suitable for detecting the output of AlGaAs double heterostructure junction lasers which typically operate at wavelengths of 0.8–0.9 $\mu m$.

Our analysis shows that each photodiode should contribute approximately the same photocurrent in order to generate the maximum photovoltage. This condition translates into making the thickness of the light absorbing layers either of uniform thickness, or of progressively increasing thicknesses depending on the direction of incidence of the radiation to be detected and/or the detector geometry.

Thus, radiation to be detected can be made incident normal to the layers of the detector, in which case the light absorbing layers of the photodiodes get progressively thicker away from the light input surface. Alternatively, the radiation to be detected can be made incident parallel to the layers, in which case all of the light absorbing layers have essentially the same thickness. In a third embodiment the normal incidence aspect of the first embodiment and the uniform thickness of the second are combined, but, to do so, the detector has a stepped configuration so that the radiation impinges directly and substantially simultaneously on the exposed portions of all of the photodiodes.

BRIEF DESCRIPTION OF THE DRAWING

Our invention, together with its various features and advantages, can be readily understood from the following more detailed description taken in conjunction with the accompanying drawing which, in the interests of clarity, is not drawn to scale.

DETAILED DESCRIPTION

Normal Incidence Detector

Figure 1:
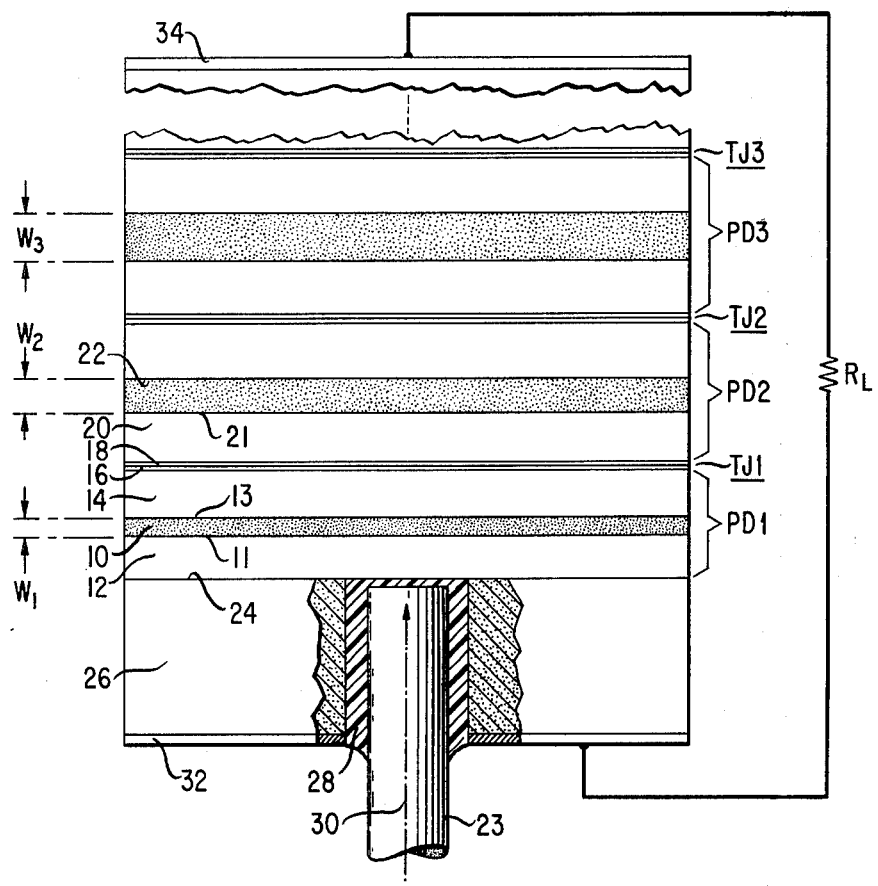
FIG. 1 is a schematic side view and partial cross-section of one embodiment of our invention in which radiation to be detected is made incident normal to the layers of the detector.

With reference now to FIG. 1, there is shown an integrated optical detector, a multilayered semiconductor structure comprising a plurality $n$ of photodiodes PD1, PD2 ... PD$n$ interleaved with a plurality ($n$-1) of tunnel junctions TJ1, TJ2, ... TJ($n$-1).

Each photodiode is preferably a double heterostructure comprising, for example, light or radiation absorbing layer 10 sandwiched between a pair of wider bandgap, radiation transparent layers 12 and 14 which are of opposite conductivity types (compared to one another). The absorbing layer 10 has a narrower bandgap than layers 12 and 14 so that heterojunctions are formed at interfaces 11 and 13 with wider bandgap layers 12 and 14, respectively. The bandgap discontinuity at the heterojunctions confines photocarriers to the absorbing layer and thus enhances collection efficiency. Layer 10 may be either n-type, p-type, compensated or intrinsic. However, the carrier concentration in layer 10 is a trade-off between low series resistance and high collection efficiency. In an absorbing layer which is not fully depleted, a higher carrier concentration (e.g., $10^{16}$ cm$^{-3}$) in the absorbing layer reduces the series resistance and therefore, advantageously, increases the fill factor which is related to the area under a plot of open circuit photovoltage versus short-circuit photocurrent. On the other hand, a lower carrier concentration (e.g., $10^{14}$ cm$^{-3}$) yields a longer carrier diffusion length and therefore increases the probability that photocarriers will be collected at the p-n junction of each photodiode, but can add in a large series resistance in the undepleted region.

Another consideration is the position of the p-n junction relative to input surface 24 where radiation to be detected is made normally incident. That is, it may be advantageous from a collection standpoint to locate the p-n junction of each photodiode so that it is at the interface of the absorbing layer which is proximate the radiation input surface such as 24. For example, in PD1 and PD2, respectively, the p-n junctions would be at interfaces 11 and 21. This configuration takes advantage of the fact that the radiation intensity decreases away from input surface 24 and, therefore, is higher at the proximate interface of an absorbing layer (e.g., interface 11 of PD1) than at its remote interface (e.g., interface 13). Because more photocarriers are generated near interface 11 than near interface 13, better collection efficiency is probably obtained by positioning the p-n junction at interface 11.

Each tunnel junction comprises a pair of opposite conductivity type, degenerately doped layers 16 and 18, for example, arranged so that layer 16 of TJ1 has the same conductivity type as adjacent wide bandgap layer 14 of PD1, whereas layer 18 of TJ1 has the same conductivity type as adjacent wide bandgap layer 20 of PD2. The tunnel junctions should be fabricated so as to absorb as little of the radiation to be detected as possible. Thus, if the tunnel junctions include radiation absorbing semiconductive layers, then the layers should be made very thin relative to an absorption length (e.g., very thin relative to 1 $\mu$m at 8500 Angstroms in GaAs). Alternatively, the layers of the tunnel junctions could be made of radiation-transparent material; e.g., they could be degenerately doped portions of the contiguous wide bandgap layers of the photodiodes. In either case, however, thin tunnel junction layers are also desirable in order to reduce free carrier absorption.

In operation, light or radiation to be detected is made incident normal to the layers of the detector. In one illustrative embodiment radiation carried by optical fiber 23 is made incident on input surface 24 by etching or otherwise forming a hole in semiconductor substrate 26 on which the multilayered structure of the detector is fabricated. The need to form a hole in the substrate however, would be obviated by utilizing a radiation transparent substrate or radiation incident on the topmost surface opposite the substrate. Fiber 23 is secured in the hole with epoxy 28 or other suitable means. Radiation 30 to be detected propagates along the fiber 22, through the lowermost wide bandgap layer 12 of PD1 to narrow bandgap layer 10 where a portion of it is absorbed. The absorption of radiation 30 generates electron-hole pairs and consequently a photocurrent which is connected to a load $R_L$ by means of annular contact 32 to substrate 26 and contact 34 to the topmost layer of the multilayered structure. Inasmuch as the radiation 30 is not totally absorbed in layer 10, the total photocurrent flowing through $R_L$ has other components; namely, photocurrent generated by radiation which reaches the absorbing layers of PD2, PD3 ... PD$n$. In particular, radiation not absorbed in layer 10 is transmitted through wide bandgap layer 14, through the thin tunnel junction layers 16 and 18, and through wide bandgap layer 20 of PD2 to the absorbing layer 22 of PD2. As in layer 10, the absorbed radiation generates electron-hole pairs in layer 22 and hence a photocurrent which flows through $R_L$.

Figure 2:
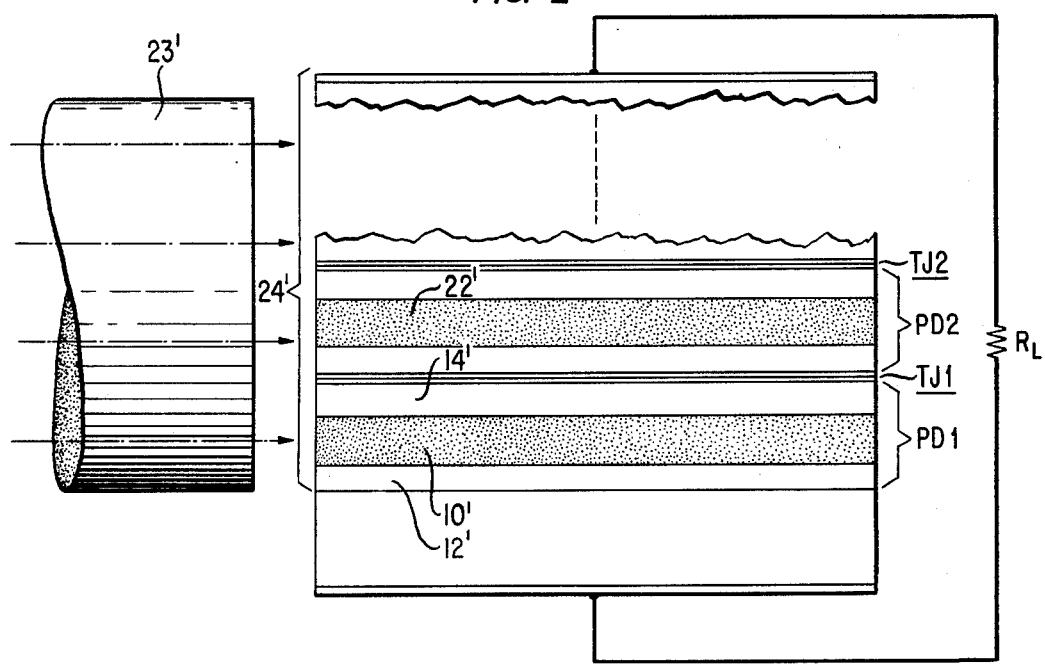
FIG. 2 is a schematic side view of another embodiment of our invention in which radiation to be detected is made incident parallel to the layers of the detector.
Figure 3:
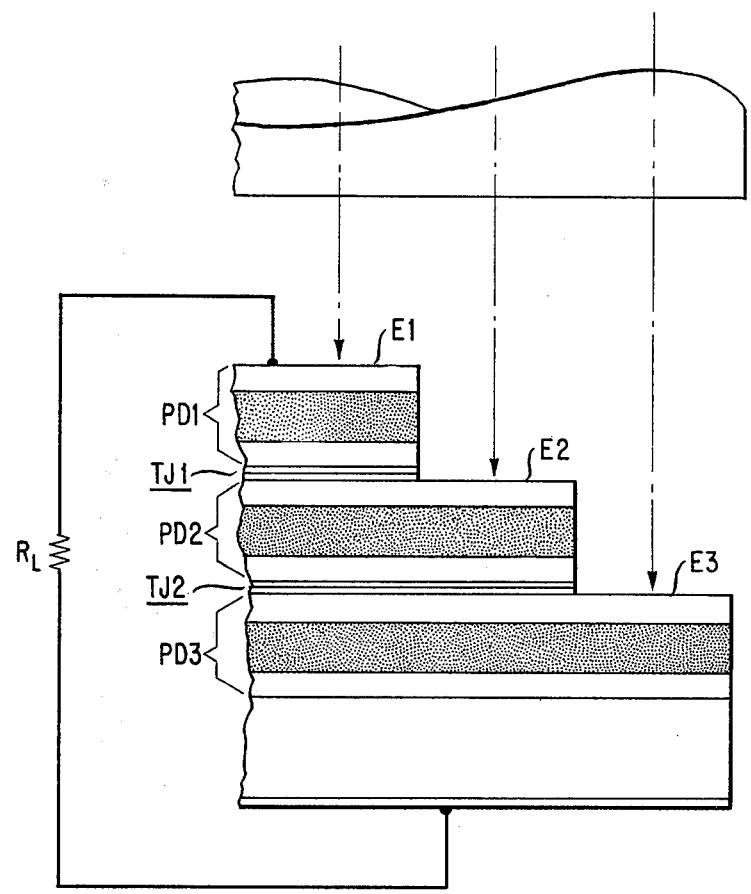
FIG. 3 is a schematic side view of a third embodiment of our invention employing a stepped configuration as well as normal radiation incidence.

In this configuration, as well as in FIGS. 2 and 3, it can be shown that the tunnel junctions are forward-biased and act essentially as short-circuits coupling together the photodiodes in a series, voltage adding relationship; therefore, the total photovoltage across $R_L$ approaches the sum of the photovoltages of the individual photodiodes.

Our analysis has further shown that in order to maximize the photovoltage from this multilayered structure, each photodiode should contribute essentially the same photocurrent to the total photocurrent flowing through $R_L$. As a consequence, in FIG. 1 the thicknesses $W_1$, $W_2$ ... $W_n$ of the successive absorbing layers should increase gradually to compensate for the decreasing fraction of incident light available to generate electron-hole pairs in each photodiode. Thus, layer 10 which is nearest the input surface 24 is the thinnest and the $n^{th}$ absorbing layer (not shown) is the thickest; i.e., $W_1 < W_2 < W_3 < ... < W_n$. Of course, if the input surface were at the top of the device (as in the example which follows), the sequence would be reversed so that $W_1 < W_2 < W_3 < ( ... < W_n$. Because the intensity of light incident on an input surface decays approximately exponentially away from that surface, the absorbing layer thicknesses should increase with distance away from that surface in such manner that each photodiode absorbs essentially the same fraction of the available incident radiation. Neglecting absorption in the wider bandgap layers and in the tunnel junctions and neglecting interface reflection losses, we can calculate the thickness profile of the absorbing layers. For example, for a detector of six photodiodes, it can be shown that approximately 95% of the incident radiation is absorbed after passing through the photodiodes with each photodiode absorbing essentially the same power, if the following sequence of active layer thicknesses are used:

$\alpha W_1 = 0.17$, $\alpha W_2 = 0.21$, $\alpha W_3 = 0.26$, $\alpha W_4 = 0.36$, $\alpha W_5 = 0.57$ and $\alpha W_6 = 1.43$ where $\alpha$ is the absorption coefficient of the absorbing layer (e.g., $\alpha = 10^4 \text{ cm}^{-1}$ for GaAs). That is, in order to absorb 95% of the incident light the total thickness $W_1 + W_2 + \ldots + W_n$ of the absorbing layers should be about three absorption lengths (i.e., $> 3 \alpha^{-1}$) and to absorb 99% should be about $4.6 \alpha^{-1}$. Since nearly all of the incident light can be absorbed in about $4.6 \alpha^{-1}$, little advantage, in terms of total photovoltage or photocurrent, is obtained by making the total thickness of the absorbing layers any greater.

EXAMPLE

In order to demonstrate the efficacy of the detector of FIG. 1 to produce a total photovoltage which approached the sum of the photovoltages of the individual photodiodes (i.e., the efficacy of the tunnel junctions to act as short-circuits between the photodiodes), we fabricated the following structures from the GaAs-AlGaAs materials system using molecular beam epitaxy for the growth technique.

We first fabricated a double-heterostructure photodiode (designated PC-5) on an n-type GaAs substrate doped with Si to $2 \times 10^{18} \text{ cm}^{-3}$. On the substrate we grew the following layers in the order recited: a buffer layer, a layer of n-$Al_{0.3}Ga_{0.7}As$, a p-GaAs light-absorbing layer about 0.5 $\mu$m thick and lightly doped with Be to about $4 \times 10^{16} \text{ cm}^{-3}$, and a p-$Al_{0.3}Ga_{0.7}As$ layer. Using an AlGaAs double heterostructure junction laser operating at 8200 Angstroms, focused to a 12 $\mu$m diameter area and incident normal to the p-AlGaAs layer (not through an etched hole in the substrate), we measured an open-circuit voltage of about 0.9 V and a short-circuit current of about 0.5 mA.

In a similar fashion we fabricated a pair of double heterostructure photodiodes (designated PC-6) coupled by a single tunnel junction. The approximate parameters for the layers are given in the following table:

| Layer | Thickness ($\mu$m) | Carrier Conc ($\text{cm}^{-3}$) |
| --- | --- | --- |
| n-GaAs: sub | — | $\sim 2 \times 10^{18}$ |
| n-GaAs: buffer | 0.16 | $\sim 5 \times 10^{17}$ |
| n-$Al_{.3}Ga_{.7}As$ | 1.59 | $\sim 5 \times 10^{16}$ |
| p-GaAs | 0.81 | $\sim 4 \times 10^{16}$ |
| p-$Al_{.3}Ga_{.7}As$ | 1.59 | $\sim 2 \times 10^{18}$ |
| p-GaAs | 0.016 | $\sim 5 \times 10^{19}$ |
| n-GaAs | 0.016 | $\leq 1 \times 10^{19}$ |
| n-$Al_{.3}Ga_{.7}As$ | 1.56 | $\sim 5 \times 10^{16}$ |
| p-GaAs | 0.65 | $\sim 4 \times 10^{16}$ |
| p-$Al_{.3}Ga_{.7}As$ | 1.81 | $\sim 2 \times 10^{18}$ |

The n-type layers were doped with Sn whereas the p-type layers were doped with Be. Electrical contacts included an indium layer on the substrate and Cr-Au dot on the top p-AlGaAs layer. (For simplicity the annular contact 32 and etched hole configuration of FIG. 1 were not used). Once again radiation from a double heterostructure AlGaAs junction laser operating at about a 3 mW output power level was focussed to a 12 $\mu$m diameter area onto the top (1.81 $\mu$m thick) p-AlGaAs layer. Measurements were made on ten such detectors. All but one, which was open-circuited, exhibited peak open-circuit photovoltages between about 1.27 V and 1.76 V, far in excess of either the actual 0.9 V obtained from PC-5 or the maximum attainable (about 1.2 V) from a single GaAs photodiode of any known type. This experiment demonstrated clearly that a substantial increase in photovoltage can be obtained by a series arrangement of the type shown in FIG. 1 in which photodiodes are coupled together by forward-biased tunnel junctions. The same measurements showed that the double photodiode detectors had peak short-circuit photocurrents ranging between about 0.30 and 0.55 mA. At a given input power, higher short-circuit currents are expected either by using thicker absorbing layers, better matching of the characteristics of photodiodes, lower contact impedances and/or higher doping levels in the tunnel junctions.

PARALLEL INCIDENCE DETECTOR

In an alternative embodiment of our invention, light to be detected is made incident on the side of the multilayered structure and parallel to the layers; i.e., on input surface 24' which is perpendicular to the layers. Radiation from optical fiber 23', for example, is therefore incident simultaneously, and with essentially the same intensity, on all of the radiation-absorbing layers of photodiodes PD1, PD2 . . . PDn. However, in this embodiment, in order to make the photocurrent contributions of each photodiode essentially equal, the thicknesses of the absorbing layers (e.g., 10', 22') should be equal to one another and approximately a carrier diffusion length thick (about 3–10 $\mu$m in GaAs depending on doping level). On the other hand, the wide bandgap layers, such as 12' and 14', should be made as thin as possible in order to reduce transmission losses, yet thick enough to confine photocarriers to the absorbing layers. Finally, in contrast to FIG. 1, the p-n junction of each photodiode can be positioned at either heterojunction because there is essentially no difference in radiation intensity between the two locations.

In contrast with the normal incidence embodiment of FIG. 1, the total thickness of the absorbing layers is not limited by the absorption length of the semiconductor since the absorption length is measured in a direction parallel to the absorbing layers. Consequently, a larger number of photodiodes with thicker absorbing layers can be employed to possibly yield higher photovoltages and photocurrents — limited only by the number of photodiodes which can be stacked within the beam aperture and by the difficulty in coupling a light beam of one shape (e.g., circular in the case of a fiber) into a detector of a different shape (e.g., an elongated rectangle as viewed looking into input surface 24' of FIG. 2).

STEPPED DETECTOR — NORMAL INCIDENCE

At the expense of a slight increase in fabrication complexity, it is possible to stack a plurality of photodetectors without having the sum of the thicknesses of the absorbing layers limited by the absorption length as in FIG. 1 and to be able to do so without utilizing the relatively inefficient coupling configuration employed in FIG. 2.

A third embodiment of our invention, which we expect will attain these objects, is depicted schematically in FIG. 3. As before, a plurality $n$ of photodiodes PD1, PD2, and PD3 ($n = 3$ for illustrative purposes only) are interleaved with tunnel junctions TJ1 and TJ2. The structure has a stepped configuration so that each photodiode has a portion E1, E2, E3 which is directly exposed to radiation made incident normal to the layers and each photodiode, except the topmost, has a portion covered by an overlying photodiode. This means that, in the region of the steps, no photodiode absorbing layer nearer to the input surface is interposed between the source of the input surface and a photodiode absorbing layer farther therefrom.

As before, the contributions of each photodiode to the total photocurrent should be essentially equal. To this end, the areas of the exposed portions E1, E2 and E3 should be equal to one another, assuming a uniform distribution of radiation (beam) intensity. If the beam had a nonuniform, but known, distribution, it would be advantageous to design the areas of the exposed portions to be unequal in such a way as to accommodate the nonuniformity and produce essentially equal photocurrent contributions from each photodiode.

In addition, in order to maximize the photocurrent from each photodiode, each absorbing layer should be about 3-4.6 $\alpha^{-1}$ thick so that 95-99% of the radiation is absorbed. This also means that little of the radiation passing through PD1, for example, reaches the absorbing layer of PD2 to generate photocurrent. Since the latter contribution to the photocurrent of PD2 would be insignificant, no adjustment in the areas of the exposed portion E2 would be necessitated. A similar comment applies to the radiation passing through PD1 to PD3 and through PD2 to PD3. In order to enhance collection efficiency, the p-n junction is advantageously positioned at the interface of the absorbing layer which is proximate the radiation input surfaces, as in the embodiment of FIG. 1.

The actual shape of the steps of FIG. 3 in plan view would depend upon the beam shape and should be designed to enhance coupling efficiency. Thus, while the steps might be rectangular, concentric circles (i.e., an annular shape) would be particularly advantageous for detecting radiation from a circular optical fiber. In the latter case, for example, the annular areas of the steps would be mutually adapted to the beam intensity distribution to yield essentially equal photocurrent contributions by each photodiode.

Note also that the tunnel junctions advantageously do not cover the exposed portions E1, E2 and E3, especially where they are made of absorbing, albeit thin, material. On the other hand, if the tunnel junctions were made of transparent material they might cover, or not be removed from, the exposed portions in order to save processing steps.

From a fabrication standpoint, the embodiment of FIG. 3 can be constructed by epitaxially growing the photodiodes and tunnel junctions of uniform length on a wafer. The stepped configuration could then be formed by well-known photolithographic masking and etching techniques. Where the layers comprise GaAs and AlGaAs, KI + I$_2$ can be used to stop-etch the Al$_x$Ga$_{1-x}$As (x $\geq$ 0.15) and alkaline peroxide (pH ~ 7) can be used to stop-etch the GaAs layers. Alternatively, a sequence of shadow masks of progressively smaller area apertures can be used to grow the structure directly by MBE.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the double heterostructure photodiodes employed in our invention can be made from any number of materials systems such as Group III-V or Group II-VI compounds depending on the wavelength of radiation to be detected (which is related to the bandgap of the absorbing layers) and the availability of a suitable growth technique. We chose MBE in our experiments because of the good quality control which is possible over both layer thickness and carrier concentration. However, other growth proceses such as CVD or LPE should also be suitable. Moreoever, within the scope of Group III-V compounds the photodiodes described herein generally comprise wide bandgap, transparent layers of Al$_x$Ga$_{1-x}$As and Al$_z$Ga$_{1-z}$As and an absorbing layer of Al$_y$Ga$_{1-y}$As such that $y < x$ and $z$, and $y$ is chosen so that the bandgap of the absorbing layer is not greater than the energy of the radiation to be detected. Similar compositions include quaternary compounds such as AlGaAsP and InGaAsP. InGaAsP-InP-InGaAsP double heterostructures are particularly suitable for detection of radiation wavelengths in the 1.0-1.2 $\mu$m range. In the case of photodiodes fabricated from AlGaAs, the tunnel junctions can be made of separate GaAs layers, as described above, or can be degenerately doped portions of the AlGaAs wide bandgap layers. Alternatively, the tunnel junctions could be fabricated from layers of Ge which is substantially lattice matched to GaAs and AlGaAs. In addition, Ge has a low absorption coefficient for GaAs laser radiation because it is an indirect gap semiconductor.

What is claimed is:

1. An integrated optical detector comprising a multilayered semiconductor structure in which first groups of layers form a plurality of stacked photodiodes and second groups of layers form a plurality of tunnel junctions interleaved with said photodiodes.

2. The detector of claim 1 wherein each of said photodiodes contributes essentially the same photocurrent to the total photocurrent of said detector.

3. The detector of claim 1 wherein each of said photodiodes is a double heterostructure comprising a pair of wide bandgap layers transparent to the radiation to be detected and a radiation-absorbing layer interposed between and contiguous with said wide bandgap layers.

4. The detector of claim 1 including a radiation absorbing layer in each of said photodiodes and an input surface parallel to said layers and onto which radiation to be detected is made incident, and wherein said absorbing layers get progressively thicker the farther they are from said input surface.

5. The detector of claim 4 wherein said absorbing layers get progressively thicker the farther they are from said input surface in such manner that each layer absorbs the same fraction of the available input radiation.

6. The detector of claim 5 wherein the sum of the thicknesses of said absorbing layers is greater than the absorption length of radiation therein.

7. The detector of claim 6 wherein said sum is greater than three absorption lengths.

8. The detector of claim 1 including a radiation absorbing layer in each of said photodiodes and an input surface normal to said layers and onto which radiation to be detected is made incident, and wherein said absorbing layers have thicknesses essentially equal to one another.

9. The detector of claim 8 wherein the thickness of each of said absorbing layers is approximately equal to the diffusion length of carriers therein.

10. The detector of claim 8 wherein said wide bandgap layers are sufficiently thin to reduce transmission losses through said detector.

11. The detector of claim 3 wherein each of said tunnel junctions comprises a pair of opposite conductivity type, degenerately doped layers, each layer of each tunnel junction being contiguous with a wide bandgap layer of the same conductivity type of an adjacent photodiode.

12. The detector of claim 11 wherein each of said wide bandgap layers comprises AlGaAs, each of said absorbing layers comprises GaAs and each of said tunnel junction layers comprises GaAs or AlGaAs.

13. The detector of claim 3 including an input surface parallel to said layers and onto which radiation to be detected is made incident, and wherein each of said absorbing layers includes a p-n junction located at the interface with the wide bandgap layer which is proximate said input surface.

14. The detector of claim 1 wherein said structure has a stepped configuration which in the region defined by steps directly exposes at least a portion of each of said photodiodes to radiation made incident essentially normal to the steps.

15. The detector of claim 14 wherein each of said photodiodes includes a radiation absorbing layer having a thickness of at least one absorption length.

16. The detector of claim 15 wherein each of said absorbing layers has a thickness greater than three absorption lengths.

17. The detector of claim 15 wherein in the region of any directly exposed portion, no absorbing layer nearer said input surface is interposed between said input surface and an absorbing layer farther therefrom.

18. The detector of claim 14 wherein the areas of said exposed portions are adapted to the intensity distribution of said radiation so that the photocurrent contributions of said photodiodes are essentially equal to one another.

19. The detector of claim 18 wherein each of said photodiodes includes an absorbing layer of essentially the same thickness.

20. An integrated optical detector comprising a multi-layered structure in which:
at least one layer forms an input surface onto which radiation to be detected is made incident essentially normal to said layers;
first groups of layers form a plurality of stacked, double heterostructure photodiodes, each of said photodiodes comprising: a pair of wide bandgap, opposite conductivity type, transparent layers; a narrower bandgap radiation-absorbing layer sandwiched between said transparent layers; and a p-n junction located at the interface with the wide bandgap layer which is proximate said input surface; and
second groups of layers form a plurality of tunnel junctions interleaved with said photodiodes, each of said tunnel junctions comprising: a pair of opposite conductivity type, degenerately doped layers, each degenerately doped layer being contiguous with a wide bandgap layer of the same conductivity of an adjacent photodiode.

21. The detector of claim 20 wherein each of said wide bandgap layers comprises AlGaAs, each of said absorbing layers comprises GaAs, and each of said tunnel junction layers comprises GaAs or AlGaAs.

22. The detector of claim 20 wherein said absorbing layers get progressively thicker the farther they are from said input surface and the sum of the thicknesses of said absorbing layers is greater than about three absorption lengths therein.

23. The detector of claim 20 wherein each of said absorbing layers having essentially the same thickness, said thickness is greater than about three absorption lengths therein, and said detector has a stepped configuration which in the region defined by steps directly exposes at least a portion of each of said photodiodes to said radiation, and in the region of any directly exposed portion no absorbing layer nearer said input surface is interposed between said input surface and an absorbing layer farther therefrom.

24. An integrated optical detector comprising a multi-layered structure in which:
an input surface is formed perpendicular to said layers and onto which radiation to be detected is made incident essentially parallel to said layers;
first groups of layers form a plurality of stacked double heterostructure photodiodes, each of said photodiodes comprising: a pair of wide bandgap, opposite conductivity type, transparent layers; a narrower bandgap radiation-absorbing layer sandwiched between said transparent layers; said absorbing layers having thicknesses essentially equal to one another and approximately equal to a carrier diffusion length therein; and
second groups of layers form a plurality of tunnel junctions interleaved with said photodiodes, each of said tunnel junctions comprising: a pair of opposite conductivity type, degenerately doped layers, each degenerately doped layer being contiguous with a wide bandgap layer of same conductivity type of an adjacent photodiode.

25. The detector of claim 24 wherein each of said wide bandgap layers comprises AlGaAs, each of said absorbing layers comprises GaAs, and each of said tunnel junction layers comprises GaAs or AlGaAs.

* * * * *